United States Patent [19]

Strnad

[11] Patent Number: 5,334,955
[45] Date of Patent: Aug. 2, 1994

[54] CABLE SIGNAL INTERFERENCE SUPPRESSOR

[76] Inventor: Edward F. Strnad, 1118A Vincent St., Redondo Beach, Calif. 90277

[21] Appl. No.: 24,450

[22] Filed: Mar. 1, 1993

[51] Int. Cl.$^5$ .................................................. H03H 7/01
[52] U.S. Cl. ..................................... 333/12; 333/181; 336/176
[58] Field of Search ....................... 333/12, 181, 185; 336/92, 175, 176

[56] References Cited

U.S. PATENT DOCUMENTS

| | | | |
|---|---|---|---|
| 4,719,433 | 1/1988 | Häckel et al. | 333/12 |
| 4,885,555 | 12/1989 | Palmer | 333/12 |
| 4,885,559 | 12/1989 | Nakano | 333/12 X |
| 4,964,012 | 10/1990 | Kitagawa | 333/12 X |
| 4,972,167 | 11/1990 | Fujioka | 333/12 X |

*Primary Examiner*—Paul Gensler
*Attorney, Agent, or Firm*—Roger A. Marrs

[57] ABSTRACT

A signal filter is disclosed herein for the filtering of electromagnetic interference carried by an electrical conductor having a housing enclosing a core of soft ferrite composition with a weak magnetic field impressed upon it adapted to be placed about the electrical conductor having a directional signal flow within the electromagnetic generation pattern of the conductor to absorb signal interference emission accompanying a transmitted signal. The housing has an indicator identifying magnetic flux directional polarity of the core. The housing may include a retaining strap or securement prongs that engage with the cable to maintain the filter in place.

3 Claims, 1 Drawing Sheet

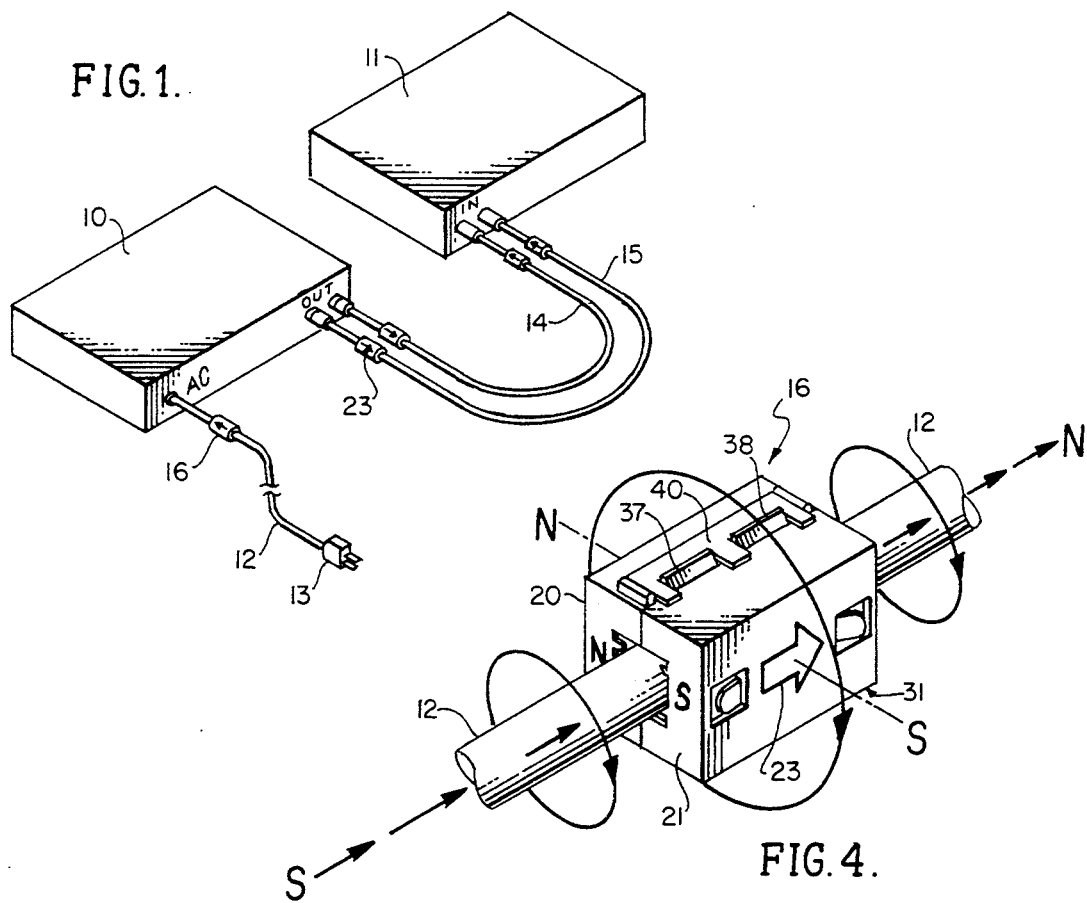
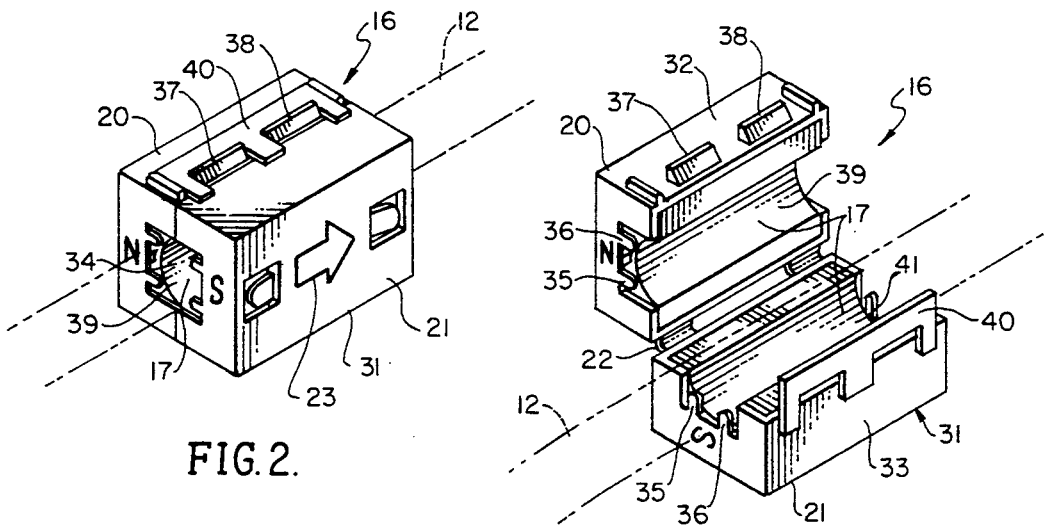

CABLE SIGNAL INTERFERENCE SUPPRESSOR

BACKGROUND OF THE INVENTION

1. Field of the Invention

The present invention relates to the field of devices for filtering electromagnetic interference, and more particularly to a novel electromagnetic interference filter, which may be placed about the exterior of an electrical signal-carrying cord or cable so that a ferrite core is in position to absorb extraneous radio frequency electromagnetic noise waves usually present on all cables and electrical conductors.

2. Brief Description of the Prior Art

Filtering of electromagnetic interference has become a major area of concern in the transmission, reception and processing of electronic signals. Various domestic and international regulating agencies have provided limitations on interference emission levels to which producers of electronics hardware must adhere. The use of soft ferrites in the reduction of conducted interference has become an important strategy in meeting these requirements.

The application of ferrite components to reduce conducted electromagnetic interference has become more and more prevalent with faster clock speeds in today's data processing systems and with tighter mandated regulations on emission standards. The use of ferrites is effective in this application for many reasons, but their utility is derived primarily from their magnetic and dielectric frequency response characteristics.

Although ferrite compositions and materials have been known, difficulties and problems have been encountered when it was desired to mount the ferrite component into a circuit or in an effective position to achieve the filtering function. In some instances, attempts have been made to apply a ferrite component directly onto a signal-transmitting cable with the result that the ferrite material or composition would not be in the generated pattern or direction of extraneous radio frequency so as to absorb such interference accompanying an intelligence signal carried by the cable. Such problems stem largely from the fact that the ferrite component may slide or become easily dislodged from its installed position, and in other instances, it is difficult to apply the ferrite component onto a cable or electrical conductor so that it will not interfere with conductor or cable installation. Most prior applications require that the ferrite component be added during the manufacture of the cable so that once the cable has been installed, modification cannot readily be made to include the ferrite component on the cable. Of major importance is the need to install a magnetic ferrite component so that it is in proper magnetic flux directional polarity so that a harmonizing orientation is produced.

Therefore, a long-standing need has existed to provide a novel electromagnetic interference filter which employs magnetic ferrite material that can be readily installed on an existing cable and in proper magnetic flux directional orientation position for absorbing, filtering or collecting extraneous radio frequency electromagnetic waves or the like. Such a filter should include means for retaining the filter in its installed position and should provide means for clamping or fixedly securing the filter onto the cable at the critical location.

SUMMARY OF THE INVENTION

Accordingly, the above problems and difficulties are obviated by the present invention which provides a novel external noise suppression filter which reduces or eliminates radio frequency interference having a cylindrical ferrite core which is secured about the external insulation of a cable carrying signals or power. In one form, the housing may take the construction of a pair of identical halves which are hingeably connected together along one side, and having snap-lock means on its opposite side. The ferrite core is split in half so that one section of the core is enclosed within one-half of the housing and the other portion or segment of the core is enclosed by the other half of the housing. An open-ended bore is provided in the ferrite material when the housing is closed so that the bore accommodates the diameter of the cable. Means are provided on opposite ends of the housing for grasping or gripping the cable so that the suppressor will not move and will be positively retained on the cable. Such retention means may include integral prongs provided on the casing which embed in the insulation of the cable, or in another embodiment, such means may be a strap having one end fixed to the housing and the other end adapted to be passed or trained about the cable and drawn through a friction buckle for retention.

Therefore, it is among the primary objects of the present invention to provide a novel polarized interference filter device that is adapted to be clamped onto or around audio, video, CATV or AC-power cables for the absorption of extraneous radio-frequency electromagnetic waves that are normally present on all cables.

Another object of the present invention is to provide a novel ferrite filter for electromagnetic interference employing the principles of high-frequency signal attenuation through electromagnetic induction with means for indicating directional orientation of magnetic polarity (i.e., North or South) of the ferrite core to achieve a higher degree of filtering action than is normally obtained.

Another object of the present invention is to provide a novel noise filter having directional orientation means as noted above for electrical power and signal cables, which is relatively inexpensive and cost-effective when compared with conventional and prior art filters such as disclosed in U.S. Pat. No. 4,885,559 which does not have magnetic polarity indicating means.

Yet another object of the present invention is to provide a novel noise filter for electronic and electrical cables which will eliminate or reduce undesired noise so that the main signal is "purified" and uncontaminated.

Still a further object of the present invention is to provide a novel noise filter employing a ferrite/ferrous core material enclosed in a housing which is fixedly secured or held onto the external surface of a power or signal cable so that the core is in the electromagnetic wave path of the power or signal being carried by the cable whereby undesired noise, radio-frequency electromagnetic waves or the like are suppressed or eliminated from the primary power or signal carried by the cable.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood with reference to the following description, taken in connection with the accompanying drawings in which:

FIG. 1 is a perspective view of the novel signal interference filter incorporating the present invention as used in a typical application;

FIG. 2 is an enlarged front perspective view of a filter as used in the installation of FIG. 1;

FIG. 3 is a view similar to the view of FIG. 2 illustrating the suppressor in its open position preparatory to installation about a cable; and FIG. 4 is a diagrammatic perspective view of the present invention showing the importance of magnetic directional polarity of cable current flow and filter polarity.

DESCRIPTION OF THE PREFERRED EMBODIMENT

Referring to FIG. 1, electronic equipment is indicated by numerals 10 and 11, which are of conventional design and does not form a part of the present invention. With respect to electronic equipment 10, a power cable 12 is included, which includes a plug 13, while a pair of cables 14 and 15 interconnect equipment 10 and 11 for signal and/or power transfer. Such cables are of conventional design and are normally provided with the equipment 10 and 11 when acquired. However, it is to be understood that other electrical cables may use the present invention, such as telephone cables or the like. In any event, the current or signal flow through cable generates a magnetic flux of directional polarity.

The signal interference filter of the present invention which exploits this directional polarity is illustrated as being secured on the respective cables 12, 14 and 15 and such a filter is indicated by numeral 16 with respect to cable 12. Preferably, the filter should be located as close to the equipment as possible in order to be most effective, and it is for this reason that once installed, it is important that the filter be secured or maintained in its effective position on the cable. Indicia such as arrows 23 are exposed for visual observance during installation indicating magnetic polarity of the ferrite material used in the filter so that the filter can be properly aligned with polarity of the flux generated by the cable current.

With respect to FIGS. 2 and 3, the suppressor of the present invention is illustrated in which a ferrite material (i.e., iron and ceramic composition) is weakly magnetized and constitutes a core 17 surrounded by a housing 31. As illustrated, the housing is composed of two identical halves which are joined together by a pivot or hinge arrangement 22. A directional arrow 23 may be included and is carried on the external surface of the housing 31. The arrow indicates polarity of the magnetized ferrite material, such as North-to-South Pole and/or direction of cable signal current flow. The arrow 23 is co-related with this direction as is described later with reference to FIG. 4.

Referring to FIG. 2 in detail, it can be seen that the housing portions 20 and 21 are of a square configuration and cross-section having an open-ended bore 34 extending through the central longitudinal axis of the filter which is coaxial with respect to the housing 31. It can also be seen in FIG. 3 that the housing 31 not only covers the external surface of the split ferrite material 17 in both portions or sections 20 and 21 but is split into a pair of semicircular elements 39 and 41 within the respective housing portions 20 and 21 which are joined by the hinge 22. A bore is defined by an inner wall of the core 17 so that the ferrite material 17 completely encloses the cable 12. The housing carrying the semicircular ferrite composition elements is shown in the open position in broken lines preparatory for installation about the exterior surface of cable 12 in FIG. 3. When opened, the bore is available for receiving the diameter of the cable 12.

Again the inventive suppressor 16 is of a square cross-section and includes housing halves 20 and 21. Each housing half or portion 20 and 21 includes not only a construction which covers the outer exterior of the ferrite material 17 but covers the inner portion so as to define an open-ended bore. The inner portion defining the bore is indicated by numerals 39 and 41 associated with the halves 20 and 21 respectively. It is also to be noted that the embodiment shown in FIGS. 2–4, includes a means for engaging and securing the filter to the insulation of the cable 12. In this embodiment, such a securement means includes a pair of prongs projecting into the bore, indicated by numerals 35 and 36, that are carried on the respective inner walls 39 and 41 of each housing half. The prongs 35 and 36 are carried on each end of the respective housing portions or halves 32 and 33 so that securement is made on opposite ends of the filter itself.

It is also noted that a snap-lock means is provided for releasably holding the housing portions 20 and 21 together. For example, detents 37 and 38 carried on the side of housing portion 20 are adapted to snap-lock with a latch member 40 carried on the housing portion 21. The latched or closed position is shown in FIG. 2, while the open position is shown in FIG. 3.

Of major importance is the provision of indicia, such as arrow 23 which indicates the direction of magnetic flux polarity (North to South) of the ferrite magnetic flux field. Without such a provision, the installer has no way visually of knowing how to install the filter on the cable so as to harmonize with the flux field generated by the current flow through the cable.

Referring to FIG. 4, it is seen that both the current in the cable 12 and the magnetic field in the filter 16 produce magnetic flux having polarities which need to be properly oriented in order to realize maximum possible filtering action By means of the indicia 23, the direction of the magnetic field of the filter is known before installation and can be related or oriented by the installer with the magnetic force field generated by the cable current flow. Without such consideration of field orientation, maximized filtering action cannot be provided. This is the main problem with the Nakano, U.S. Pat. No. 4,885,559 disclosure. The filter uses a soft ferrite core material which has had a weak permanent magnetic field impressed upon it. When properly oriented with the field generated by a signal-carrying conductor, this filter 16 will then produce an improvement in filtering action, over that of an unmagnetized or an unoriented magnetized filter as disclosed in Nakano.

The filter exploits the following physical facts:

1. When dc (direct current) flows through a ferromagnetic device, the current tends to premagnetize the core and reduce its inductance. However, the permeability of a ferrite material measured with superimposed dc increases slightly for very low values of dc, producing an improvement in the filter's effectiveness.

2. This effect can be duplicated by slightly premagnetizing the ferrite core pieces.

3. But the field of the pre-magnetized core must be oriented to be in agreement—and not opposition with the conductor's field—for the improved filtering effect to occur. Otherwise, the core will be prematurely saturated reducing reducing filtering action.

In view of the foregoing, it can be seen that the novel filter of the present invention provides a means for reducing or eliminating unwanted and undesired signal interference frequencies through the use of ferrite material in the form of a split core. The core is weakly magnetized and provided in a housing so that the core may be readily mounted about the external insulation of a conventional cable. The core is elongated and is placed in a coaxial relationship with respect to the cable. Means are provided for detachably connecting the housing to the cable and means are further provided for detachably connecting the housing together so that it may be opened or closed at the selection of the user. Retention means are provided on the housing for securing the filter to the cable which may take the form of previously mentioned means that embed with the insulation of the cable.

The filter is of low cost and cost-effective design. Installation and/or removal of the suppressor can be done without special tools and without special technical knowledge.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. In a polarized cable signal interference filter of electromagnetic interference emitted from a polarized electrical cable having a directional signal flow, the combination comprising:
   a housing;
   a core of weakly (less than 50 milligauss) magnetized ferrite composition enclosed by said housing;
   retaining means carried on said housing for securement with said cable;
   said housing critically disposed on said cable to place said core in effective relationship to absorb extraneous and undesired electromagnetic waves present on said cable;
   said housing is of two portion construction having a hinge means movably connecting said portions together;
   each housing portion has a semicircular recess occupied by said weakly magnetized ferrite composition when said portions are open and said semicircular portion recesses define an open-ended central circular bore when said portions are closed together;
   means carried on said housing for removably retaining and restraining said cable on said housing;
   snap-lock fastener means cooperatively carried on said housing portions for detachably connecting said housing portions together in an operative position about said cable;
   said snap-lock fastener means includes a latch disposed on one housing portion and a detent disposed on the other housing portion;
   said retaining and restraining means includes prong means carried on opposite ends of said housing engageable with the exterior of said cable in an interference relationship to retain said cable in its position on said housing;
   said core of weakly magnetized ferrite composition comprising a pair of semicircular ferrite cores wherein each of said housing portions enclose one semicircular ferrite core whereby a conformal recess is defined on each housing portion constituting said open-ended circular bore receiving said cable when said housing portions are together in said operative position about said cable;
   orientation indicia carried on said housing identifying magnetic flux directional polarity (i.e., North-to-South) of said magnetized ferrite core; orientation with the directional signal flow in said cable providing noise suppression filtering of the electrical signal flow carried by said cable in coordination with said orientation indicia.

2. The invention as defined in claim 1 wherein:
   said orientation indicia is a directional or polarity marker on the exterior of said housing pointed at a selected end of said housing augmenting said filter's ability to absorb electromagnetic field forces.

3. An improved interference filter comprising:
   an electrical cable having an assumed directional signal flow;
   a filter detachably carried on said electrical cable having a core of weakly pre-magnetized ferrite material of given polarity enclosed in a housing having an exterior surface;
   a visual marking carried on said housing exterior for properly orienting the magnetic polarity of said ferrite material; and said cable and filter are in harmonizing polarity orientation so that said filter absorbs signal interference accompanying said cable signal flow.

* * * * *